United States Patent
Maehara

(10) Patent No.: US 7,009,366 B2
(45) Date of Patent: Mar. 7, 2006

(54) VOLTAGE REGULATOR FOR CONTROLLING OUTPUT VOLTAGE OF AUTOMOTIVE ALTERNATOR

(75) Inventor: Fuyuki Maehara, Nagoya (JP)

(73) Assignee: Denso Corporation, Kariya (JP)

( * ) Notice: Subject to any disclaimer, the term of this patent is extended or adjusted under 35 U.S.C. 154(b) by 77 days.

(21) Appl. No.: 10/766,807

(22) Filed: Jan. 30, 2004

(65) Prior Publication Data

US 2004/0183514 A1   Sep. 23, 2004

(30) Foreign Application Priority Data

Feb. 10, 2003  (JP)  ............................... 2003-032595

(51) Int. Cl.
*H02J 7/04*  (2006.01)
(52) U.S. Cl. ........................... 322/28; 322/99; 320/123
(58) Field of Classification Search ................ 323/222, 323/285; 322/36, 28, 99; 307/66, 10.1; 320/64–66, 68, 127, 137
See application file for complete search history.

(56) References Cited

U.S. PATENT DOCUMENTS 5,151,646 A * 9/1992 Vercesi et al. ................ 322/28

FOREIGN PATENT DOCUMENTS

JP    A 56-150935    11/1981

* cited by examiner

*Primary Examiner*—Rajnikant B. Patel
(74) *Attorney, Agent, or Firm*—Oliff & Berridge, PLC

(57) ABSTRACT

A voltage regulator for an automotive alternator includes a switching transistor that controls an amount of field current supplied to a field coil of the alternator. The switching transistor is controlled in an ON-OFF fashion, and output voltage of the alternator is always monitored by a detector circuit that detects disconnection in a circuit for charging an on-board battery with the output voltage. It is determined that the disconnection occurred when a difference between the output voltage at a time when the switching transistor is turned off and the output voltage at a time when the switching transistor is turned on exceeds a predetermined value.

4 Claims, 3 Drawing Sheets

VOLTAGE REGULATOR FOR CONTROLLING OUTPUT VOLTAGE OF AUTOMOTIVE ALTERNATOR

CROSS-REFERENCE TO RELATED APPLICATION

This application is based upon and claims benefit of priority of Japanese Patent Application No. 2003-32595 filed on Feb. 10, 2003, the content of which is incorporated herein by reference.

BACKGROUND OF THE INVENTION

1. Field of the Invention

The present invention relates to a voltage regulator for controlling output voltage of an alternator for use in an automotive vehicle. The output voltage is controlled by controlling excitation current supplied to a field coil of the alternator.

2. Description of Related Art

A voltage regulator that includes a detector for detecting disconnection in a circuit charging an on-board battery with output voltage of an alternator is disclosed in, for example, JP-A-56-150935 and JP-B2-2954374. The disconnection includes a situation where a charging wire is disconnected from a terminal and a situation where the charging wire itself is cut off. This definition will be applied to all the description in this specification.

In this voltage regulator, both an output voltage of the alternator and a terminal voltage of the on-board battery are detected. The disconnection in the charging circuit is detected based on a difference between the output voltage and the terminal voltage. Upon detection of the disconnection, a warning light is lit to inform a driver of the malfunction.

Since both of the output voltage of the alternator and the terminal voltage of the battery have to be detected in the conventional regulator described above, the number of terminals used for the detection increases. Accordingly, the voltage regulator becomes not only complex but also expensive.

SUMMARY OF THE INVENTION

The present invention has been made in view of the above-mentioned problem, and an object of the present invention is to provide an improved voltage regulator that is able to detect disconnection in a charging circuit without using an additional terminal for detection.

A voltage regulator for controlling output voltage of an automotive alternator to a predetermined level includes a switching transistor for supplying field current to a field coil of the alternator in a controlled manner. The switching transistor is controlled in an ON-OFF fashion by a voltage control circuit. The voltage regulator further includes a detector circuit for detecting disconnection in a circuit for charging an on-board battery with the output voltage of the alternator.

The detector circuit always monitors the output voltage VB of the alternator, and disconnection in the charging circuit is detected based on a voltage difference $\Delta VB$ between an output voltage VB(OFF) detected when the switching transistor is turned off and an output voltage VB(ON) detected when the switching transistor is turned on. Preferably, it is determined that the disconnection occurred when the voltage difference $\Delta VB$ exceeds a predetermined reference voltage Vken.

Since the disconnection is detected solely based on the output voltage VB (more particularly based on $\Delta VB$), it is not necessary to detect a terminal voltage of the on-board battery. Accordingly, the voltage regulator can be simplified by limiting the number of terminals to be provided therein. In addition, a communication circuit communicating with an outside electronic control unit may be provided in the voltage regulator. When the disconnection is detected, a warning signal may be sent to the outside electronic control unit through the communication circuit. Alternatively, the warning signal may be directly utilized for lighting a warning lamp.

Other objects and features of the present invention will become more readily apparent from a better understanding of the preferred embodiment described below with reference to the following drawings.

DETAILED DESCRIPTION OF THE PREFERRED EMBODIMENT

Figure 1:
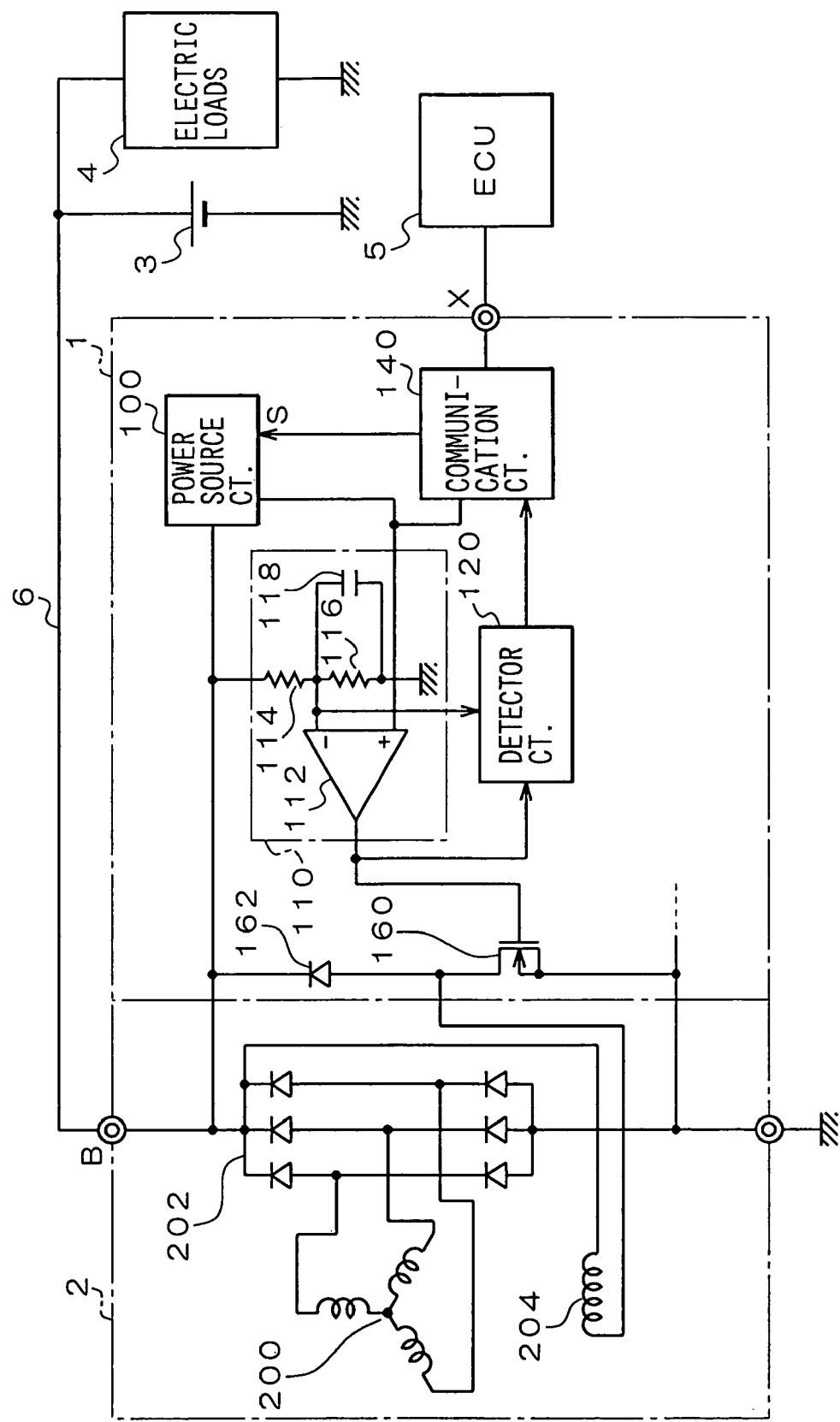
FIG. 1 is a block diagram showing an electric circuit including an automotive alternator and a voltage regulator.

A preferred embodiment of the present invention will be described with reference to accompanying drawings. First, referring to FIG. 1, an entire circuit of an automotive alternator 2 and a voltage regulator 1 will be described. The voltage regulator 1 controls current supplied to a field coil of the alternator 2, thereby regulating output voltage (voltage VB at a B-terminal) of the alternator 2 to a predetermined level, e.g., 14 volts.

The alternator 2 is mainly composed of a three-phase stator winding 200, a full wave rectifier 202 for rectifying an alternating current output of the alternator into a direct current output, and a field coil 204 wound on a rotor core. The output voltage of the alternator, i.e., the voltage at a B-terminal, is controlled to a predetermined level by controlling current supplied to the filed coil 204 in an ON-OFF fashion. This ON-OFF control is performed by the voltage regulator 1. The B-terminal is connected to an on-board battery 3 and electric loads 4 of an automotive vehicle through a charging wire 6. The circuit including the B-terminal, the charging wire 6 and terminals of the on-board battery 3 and the electric loads 4 is referred to as a charging circuit. The voltage regulator 1 is also connected to an electronic control unit (ECU) 5 through a communication terminal X.

The voltage regulator 1 includes a power source circuit 100, a voltage control circuit 110, a detector 120 for detecting disconnection in the charging circuit, a communication circuit 140, a switching transistor 160 (also referred to TR) for controlling excitation current supplied to the field coil 204, and a diode 162. The power source circuit 100 generates a predetermined operating voltage when a signal to turn on a power source is fed from a key-switch of a vehicle through a terminal S. The operating voltage is supplied to each component of the voltage regulator 1.

The voltage control circuit 110 generates PWM (pulse width modulated) signals to be supplied to the switching transistor 160. The voltage control circuit 110 is composed of a comparator 112, resistors 114, 116, and a capacitor 118. The output voltage of the alternator 2 (the voltage at the B-terminal) is divided by a divider circuit composed of the resistors 114 and 116, and the divided voltage is smoothened by the capacitor 118 and supplied to a minus terminal of the comparator 112. A target voltage Vreg, to which the output voltage VB is to be regulated, is fed to a plus terminal of the comparator 112 from the communication circuit 140. More precisely, the voltage fed to the plus terminal is a voltage obtained by dividing the target voltage Vreg by a ratio of the divider resistors 114, 116. This is because a voltage obtained by dividing the output voltage VB by the ratio of the divider resistors is fed to the minus terminal of the comparator 112.

The comparator 112 outputs a low level signal when the output voltage VB is higher than the target voltage Vreg and a high level signal when VB is lower than Vreg. The signals from the comparator 112 are fed to the switching transistor 160 that controls the excitation current supplied to the field coil 204 according to the signals fed thereto, and thereby the output voltage VB of the alternator 2 is controlled to the target voltage Vreg. The detector circuit 120 for detecting disconnection in the charging circuit detects disconnection based on the output voltage VB in the manner explained later in detail.

Figure 2:
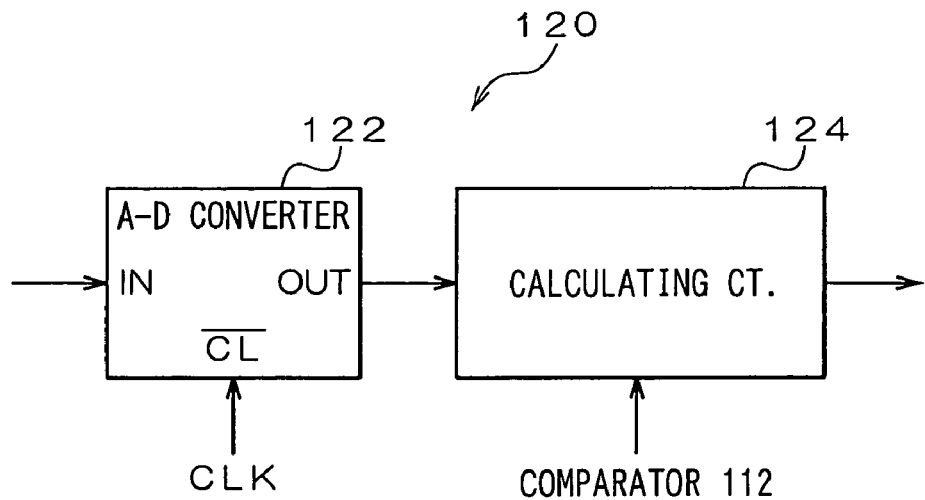
FIG. 2 is a block diagram showing a detector for detecting disconnection in a charging circuit, the detector being included in the voltage regulator shown in FIG. 1.

As shown in FIG. 2, the detector circuit 120 is composed of an A-D converter 122 and a calculating circuit 124. The output voltage VB divided by the divider resistors 114, 116 is fed to a input terminal IN of the A-D converter 122, and a clock signal CLK in a negative logic is fed to a clock terminal CL of the A-D converter 122. The voltage fed to the IN terminal is taken into the A-D converter 122 every time the clock signal CLK turns from a high level to a low level. The voltage taken into the A-D converter 122 is converted into a digital signal in predetermined bits. For example, when the clock signal CLK has a cycle period 0.1 ms, the digital signals corresponding to the output voltage VB are formulated every 0.1 ms.

The digital outputs from the A-D converter 122 are fed to the calculating circuit 124. The calculating circuit 124 determines whether the inputs from the A-D converter alternate at an interval of, e.g., 0.1 ms. If the outputs alternate at such an interval, the inputs from the A-D converter 122 taken into the calculator 124 are renewed at the same interval. Whether the disconnection in the charging circuit occurred or not is determined based on the renewed data. Detailed process of determination will be described later.

The communication circuit 140 shown in FIG. 1 performs serial communication with the electronic control unit 5 through the communication terminal X. A signal for initiating voltage generation and a signal indicating the target voltage Vreg sent from the electronic control unit 5 are received by the communication circuit 140. The communication circuit 140 also functions as a device for sending out an alarm signal to the electronic control unit 5 when the disconnection in the charging circuit is detected.

The switching transistor 160 for controlling the excitation current supplied to the field coil 204 in an ON-OFF fashion is composed of, for example, an N-channel MOSFET. A source terminal of the switching transistor 160 is grounded while its drain terminal is connected to one end of the field coil 204. The other end of the filed coil 204 is connected to the B-terminal. The diode 162 is connected in parallel to the field coil 204, and excitation current flowing through the field coil 204 upon turning off the switching transistor 160 is circulated through the diode 162.

The electronic control unit 5 sends to the voltage regulator 1 a signal to initiate its operation upon turning on the key-switch (not shown) of the vehicle. The target voltage Vreg is also fed from the electronic control unit 5 to the voltage regulator 1. The electronic control unit 5 performs alarming operation upon receiving the signal indicating the disconnection in the charging circuit.

The voltage regulator described above operates in the following manner. Upon turning on the key-switch of the vehicle, the electronic control unit 5 sends an initiation signal to the communication terminal X. This initiation signal is fed to the terminal S of the power source circuit 100 through the communication circuit 140. The power source circuit 100 supplies to the components of the voltage regulator 1 an operating voltage upon receiving the initiation signal. Thus, the voltage regulator 1 initiates its operation.

The alternator 2 generates a voltage according to cranking operation of an engine, but the output voltage VB does not reach the target voltage Vreg at this initial stage. The comparator 112 outputs a high level signal that turns on the switching transistor 160. When the switching transistor 160 is turned on, the exciting current is supplied to the field coil 204, and the output voltage VB gradually increases according to increase in rotational speed of the engine. When the output voltages VB reaches the level of the target voltage Vreg, the comparator 112 outputs a low level signal that turns off the switching transistor 160. Upon turning off the switching transistor 160, the exciting current flowing through the field coil 204 decreases, and accordingly the output voltage VB decreases. The ON-OFF operation of the switching transistor is repeated, and thereby the output voltage VB is regulated to the target voltage Vreg.

A difference between the output voltage VB(ON) detected when the switching transistor 160 is turned on and the output voltage VB(OFF) detected when the switching transistor 160 is turned off is small when the charging circuit is normal, i.e., when no disconnection exists therein. On the other hand, the difference is large when the disconnection in the charging circuit occurs. Therefore, the disconnection can be detected based on the difference between VB(ON) and VB(OFF).

Figure 3:
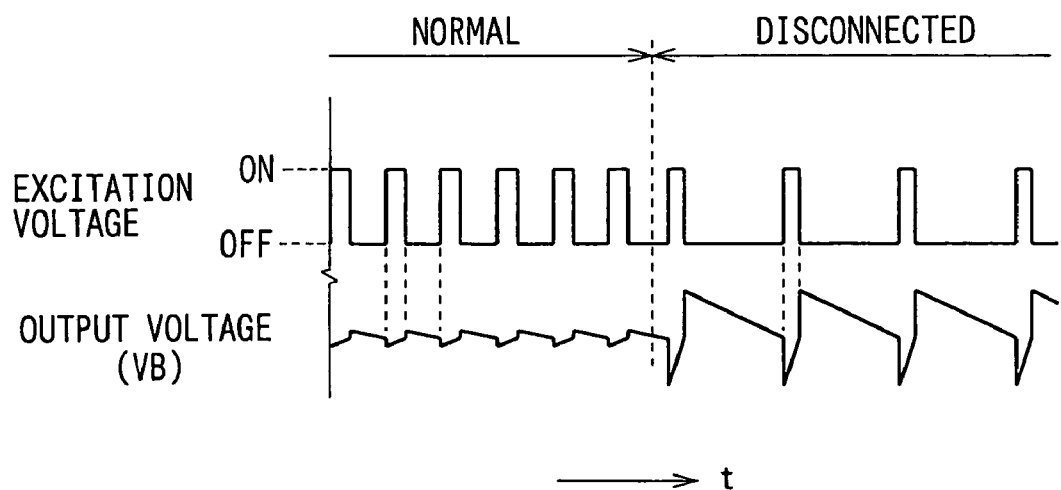
FIG. 3 is a timing chart showing excitation voltage applied to a field coil of an alternator and output voltage of the alternator.

FIG. 3 is a timing chart showing the output voltage VB when the no disconnection exists (a normal situation) and when the disconnection occurred. According to the ON-OFF operation of the switching transistor 160, the output voltage VB varies as shown in FIG. 3. Under the normal situation, the difference of the output voltages, i.e., [VB(OFF)–VB(ON)] is small, while the difference becomes considerably large when the disconnection occurs. This is because an impedance viewed from the alternator 2 becomes very large when the disconnection occurs in the charging circuit.

Figure 4:
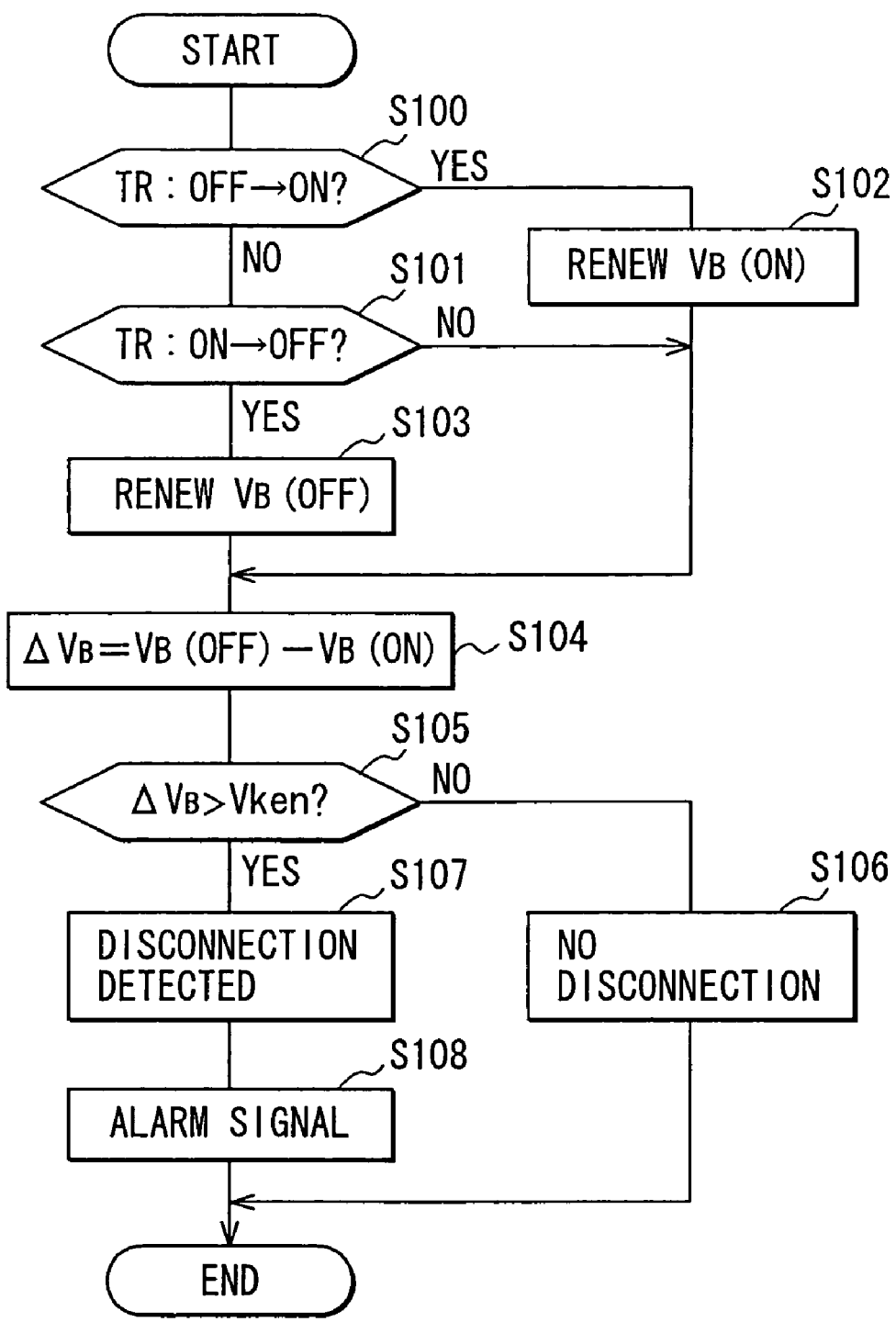
FIG. 4 is a flowchart showing a process of detecting disconnection in a charging circuit.

Referring to FIG. 4, a process of detecting the disconnection in the charging circuit will be described. This process is performed in synchronism with a cycle period of the clock signal. In other word, the process is repeatedly performed at an interval of, e.g., 1 ms. At step S100, whether the switching transistor 160 (referred to as TR) is turned ON from its OFF state is determined. Similarly, whether TR is switched from ON to OFF is determined at step S101. These determinations are made in the calculator 124 by comparing a previous output level (an output level of 1 ms earlier, for example) of the A-D converter with a present level thereof.

If TR is switched from OFF to ON, the process proceeds to step S102 where the previous output voltage VB (ON) is renewed to the present one. On the other hand, if TR is switched from ON to OFF, the process proceeds to step S103 where the previous output voltage VB(OFF) is renewed to the present one. After VB(OFF) or VB(ON) is renewed, the process proceeds to step S104. When TR is not switched to either state, the process also proceeds to step S104 without renewing the previous output voltage, VB(OFF) or VB(ON). At step S104, a voltage difference $\Delta VB=[VB(OFF)-VB(ON)]$ is calculated.

Then, the process proceeds to step S105, where whether or not the voltage difference $\Delta VB$ is larger than a predetermined reference voltage Vken is determined. If $\Delta VB$ is not larger than Vken, the process proceeds to step S106 where it is determined that there is no disconnection in the charging circuit. On the other hand, if $\Delta VB$ is larger than Vken, the process proceeds to step S107 where it is determined that there occurred the disconnection in the charging circuit. If the disconnection is detected, the process proceeds to step S108 where the communication circuit 140 sends an alarm signal to the electronic control unit 5, and then the process comes to the end. If no disconnection is detected, the process proceeds from step S106 directly to the end.

In the present invention, as described above, the disconnection in the charging circuit is detected based on the output voltage of the alternator (the voltage at the terminal VB). More particularly, the disconnection is determined based on the voltage difference $\Delta VB$ between VB(OFF) and VB(ON). Therefore, it is not necessary to detect the terminal voltage of the on-board battery 3 for detecting the disconnection in the charging circuit. As a result, the number of terminals of the voltage regulator 1 is reduced, and its manufacturing cost can be lowered. In particular, the disconnection is easily determined by simply comparing $\Delta VB$ with the reference voltage Vken. In addition, when the disconnection in the charging circuit is detected, a warning signal is sent from the communication circuit 140 to the electronic control unit 5.

The present invention is not limited to the embodiment described above, but it may be variously modified. For example, though the warning signal indicating the disconnection is sent to the electronic control unit 5 in the foregoing embodiment, the warning signal may be directly utilized as a signal for lighting a warning lamp.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A voltage regulator for controlling output voltage of an automotive alternator, the voltage regulator comprising:
   a switching transistor for controlling excitation current supplied to a field coil of the alternator in an ON-OFF fashion;
   a voltage control circuit for controlling the switching transistor to maintain output voltage of the alternator at a predetermined level; and
   a detector circuit for detecting disconnection in a circuit for charging an on-board battery with the output voltage of the alternator, the detector circuit detecting the disconnection based on a voltage difference between the output voltage of the alternator detected when the switching transistor is turned off and the output voltage of the alternator detected when the switching transistor is turned on.

2. The voltage regulator as in claim 1, wherein:
   the detector circuit determines that the disconnection in the charging circuit exists when the voltage difference exceeds a predetermined value.

3. The voltage regulator as in claim 1, further comprising means for generating a warning signal when the disconnection in the charging circuit is detected.

4. The voltage regulator as in claim 2, further comprising means for generating a warning signal when the disconnection in the charging circuit is detected.

* * * * *